United States Patent
Yamakage et al.

(10) Patent No.: US 9,438,777 B2
(45) Date of Patent: Sep. 6, 2016

(54) COMPONENT-MOUNTING MACHINE

(75) Inventors: Yusuke Yamakage, Anjo (JP);
Tomoharu Yoshino, Nagoya (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 14/417,649

(22) PCT Filed: Aug. 1, 2012

(86) PCT No.: PCT/JP2012/069630
§ 371 (c)(1),
(2), (4) Date: Jan. 27, 2015

(87) PCT Pub. No.: WO2014/020733
PCT Pub. Date: Feb. 6, 2014

(65) Prior Publication Data
US 2015/0222794 A1 Aug. 6, 2015

(51) Int. Cl.
G01R 33/00 (2006.01)
H04N 5/225 (2006.01)
G02B 13/00 (2006.01)
H05K 13/08 (2006.01)

(52) U.S. Cl.
CPC ........ *H04N 5/2254* (2013.01); *G02B 13/0015* (2013.01); *H05K 13/08* (2013.01)

(58) Field of Classification Search
CPC .................................................. H04N 5/2254
See application file for complete search history.

(56) References Cited

U.S. PATENT DOCUMENTS

2002/0031279 A1 3/2002 Shimizu
2015/0049183 A1 2/2015 Yamakage et al.

FOREIGN PATENT DOCUMENTS

| EP | 2 838 333 A1 | 2/2015 |
|---|---|---|
| JP | 2004-172465 A | 6/2004 |
| JP | 2011-165865 A | 8/2011 |
| JP | 2011-233674 A | 11/2011 |
| WO | WO 02/17357 A2 | 2/2002 |
| WO | WO 2004/046643 A1 | 6/2004 |

OTHER PUBLICATIONS

U.S. Appl. No. 14/388,096, filed Sep. 25, 2014, Yamakage et al.
International Preliminary Report on Patentability and Written Opinion issued Oct. 23, 2014 in PCT/JP2013/051503 (submitting English translation only).
Extended European Search Report issued Jun. 29, 2015 in Patent Application No. 12882524.7.

*Primary Examiner* — Roberto Velez
*Assistant Examiner* — Stephen Coleman
(74) *Attorney, Agent, or Firm* — Oblon, McClelland, Maier & Neustadt, L.L.P.

(57) ABSTRACT

A component-mounting machine which prevents collision of a sucked component with an optical system capturing images of an imaging reference mark and the sucked component simultaneously when a component-mounting head moves to capture images. A sucked-component position detection device includes an imaging unit, which is installed on a side of a base of the component-mounting machine and has an image sensor and a lens; and a first refraction member which alters a first focal position of a first optical path that connects the image sensor, the lens and the imaging reference mark. The first refraction member is installed on the side of the base and at a position lower than a second focal position of a second optical path that connects the image sensor, the lens and the sucked component.

5 Claims, 3 Drawing Sheets

COMPONENT-MOUNTING MACHINE

TECHNICAL FIELD

The present invention relates to a component-mounting machine which is able to capture images of an imaging reference mark provided on a component-mounting head and a component sucked by a suction nozzle simultaneously to detect a position of the sucked component with respect to the imaging reference mark.

BACKGROUND ART

A component-mounting machine captures images of an imaging reference mark provided on a component-mounting head and a sucked component simultaneously, and detects positional displacement or angle deviation of the sucked component from the captured image. The component-mounting machine further corrects a mounting position of the sucked component based on a detected result, such as the positional displacement and the angle deviation.

Moreover, in the component-mounting machine, the component-mounting head is designed to move at a high speed in order to shorten the time needed for mounting components. When the component-mounting head moves very fast, exposure time of imaging is shortened. Therefore, it is necessary to open the aperture of the camera to increase an amount of light received by the camera. However, if the aperture is opened, the camera has a shallow depth of field, and thus it is difficult to focus on both the imaging reference mark and the sucked component. It is the same when sucked components having different thickness are imaged simultaneously.

As an invention related to such a task, for example, inventions described in Patent Literatures 1 and 2 are known. A position detection device described in PTL 1 is provided with a position marking device and an optical imaging device on a mounting head side above a component sucked by a suction pipette, and is provided with a ground glass adjacent to the component. The position marking device is projected on the ground glass through the optical imaging device to capture images of the position marking device and the component.

A surface mounting machine related to a first invention described in PTL 2 includes a reference mark and a lens at a position higher than a focal position of a camera. The lens is able to extend the focal position of the camera upwardly up to the height of the reference mark. Furthermore, a surface mounting machine related to a second invention described in PTL 2 includes a lens which focuses the camera on the reference mark and is provided on a camera side. The machine also includes an actuator which moves the lens in an imaging range of the camera when the reference mark passes above the camera, and puts the lens outside the imaging range of the camera when a component for mounting passes above the camera. Moreover, the camera described in PTL 2 uses a CCD linear sensor as an image sensor, which is able to image the component for mounting or the reference mark one-dimensionally.

CITATION LIST

Patent Literature

PTL 1: JP-T-2001-518723
PTL 2: JP-A-2005-197564

SUMMARY OF INVENTION

Technical Problem

However, in the invention described in PTL 1, the mounting head has a complex structure since the optical imaging device is provided on the mounting head side, and thus the mounting head gets bigger and heavier. The optical imaging device or the ground glass is likely to collide with the component when the mounting head moves. Regarding the former, the first invention described in PTL 2 has the same problem.

The second invention described in PTL 2 moves the lens in or out of the imaging range of the camera. Thus it is impossible to capture images of the reference mark and the component for mounting simultaneously. Also, the second invention described in PTL 2 needs to drive the actuator along with the movement of a head unit having the reference mark, thus the control becomes quite complex.

Furthermore, the camera described in PTL 2 uses the CCD linear sensor as the image sensor, therefore the camera cannot capture images two-dimensionally. For example, in the rotary head, a plurality of the suction nozzles is rotatably held on a circumference of a circle concentrically provided with an axis line, and the component for mounting is sucked and held by each of the suction nozzles. In this case, the CCD linear sensor cannot capture images of the reference mark and a plurality of the components for mounting simultaneously.

The present invention is made in consideration of such problems, to provide a component-mounting machine which prevents collision of a sucked component with an optical system capturing images of an imaging reference mark and the sucked component simultaneously when a component-mounting head moves to capture images while lightening the component-mounting head.

Solution to Problem

A component-mounting machine described in claim 1 includes a component-mounting head having a suction nozzle which sucks a component to mount on a substrate; and a sucked-component position detection device which captures images of an imaging reference mark provided on the component-mounting head and a component sucked by the suction nozzle simultaneously to detect a position of the sucked component with respect to the imaging reference mark, wherein the sucked-component position detection device includes an imaging unit, which is provided on a base side of the component-mounting machine and has an image sensor and a lens; and a first refraction member which alters a focal position of a first optical path that connects the image sensor, the lens and the imaging reference mark, and the first refraction member is provided on the base side and at a position lower than a focal position of a second optical path that connects the image sensor, the lens and the sucked component.

A component-mounting machine described in claim 2 is the component-mounting machine of claim 1, wherein the sucked-component position detection device further includes a second refraction member which alters the focal position of the second optical path, and the second refraction member is provided on the base side and at a position lower than the focal position of the second optical path.

A component-mounting machine described in claim 3 is the component-mounting machine of claim 2, wherein the component-mounting head is a rotary head in which a plurality of the suction nozzles is rotatably held on a circumference of a circle concentrically provided with an axis line, and a plurality of the second refraction members is concentrically arranged in accordance with a height of the sucked components on the plurality of the component-mounting heads which have different circumferential diameters.

A component-mounting machine described in claim 4 is the component-mounting machine of any one of claims 1 to 3, wherein the sucked-component position detection device includes a light source which irradiates the imaging reference mark and the sucked component with light, and the first refraction member is provided on an imaging unit side than the light source.

A component-mounting machine described in claim 5 is the component-mounting machine of any one of claims 1 to 4, wherein the sucked-component position detection device further includes a light source which irradiates the imaging reference mark and the sucked components with light, and the imaging unit has an aperture which is set such that, out of reflective light emitted from the light source and reflected by the imaging reference mark and the sucked component, mainly light parallel to a height direction of the component-mounting machine arrives at the image sensor.

Advantageous Effects of Invention

According to the component-mounting machine described in claim 1, the sucked-component position detection device includes the first refraction member which alters the focal position of the first optical path that connects the image sensor, the lens and the imaging reference mark. Therefore, it is possible to alter the focal position of the first optical path with respect to the imaging reference mark arranged at a height different from that of the sucked component, and to focus on both the imaging reference mark and the sucked component. Moreover, since the first refraction member is provided at a position lower than the focal position of the second optical path that connects the image sensor, the lens and the sucked component, the first refraction member and the sucked component do not collide with each other when the component-mounting head moves to capture images. Therefore, it is not necessary to provide a mechanism for preventing collision of the first refraction member with the sucked component, thereby downsizing the sucked-component position detection device. Moreover, since the first refraction member is provided on the base side of the component-mounting machine, a configuration of the component-mounting head can be further simplified as compared with a case in which the first refraction member is provided on the component-mounting head side, thereby lightening the component-mounting head.

According to the component-mounting machine described in claim 2, since the second refraction member is provided to alter the focal position of the second optical path, it is possible to alter the focal position of the second optical path in accordance with a height of the sucked component. Moreover, since the second refraction member is provided on the base side and at a position lower than the focal position of the second optical path, it is possible to obtain a similar effect to the aforementioned effect of the first refraction member.

According to the component-mounting machine described in claim 3, the plurality of the second refraction members is concentrically arranged in accordance with a height of the sucked components on the plurality of the component-mounting heads having different circumferential diameters around which the suction nozzles rotate. Therefore, it is possible to set the focal position of the second optical path in accordance with a height of the sucked component of each component-mounting head, respectively. Moreover, it is unnecessary to replace the second refraction member every time the component-mounting head is replaced, thereby decreasing manhours.

According to the component-mounting machine described in claim 4, the first refraction member is provided on the imaging unit side than the light source that irradiates the imaging reference mark and the sucked component with light. Therefore, it is possible to prevent the light, emitted from the light source, from being guided directly to the first refraction member and being reflected by the first refraction member. Thus, it is possible to prevent the reflective light from causing an adverse effect on imaging of the imaging reference mark and the sucked component.

According to the component-mounting machine described in claim 5, the imaging unit has an aperture which is set such that, out of reflective light emitted from the light source and reflected by the imaging reference mark and the sucked component, mainly light parallel to a height direction of the component-mounting machine arrives at the image sensor. Therefore, it is possible to suppress a ghost occurrence in the captured images of the imaging reference mark and the sucked component, thereby preventing false recognition when the positions of the imaging reference mark and the sucked component are recognized.

DESCRIPTION OF EMBODIMENTS

Hereinafter, embodiments of the present invention will be described based on accompanying drawings. Each diagram is a conceptual diagram, and does not define the size of detailed structures.

(1) Component-Mounting Machine

Figure 1:
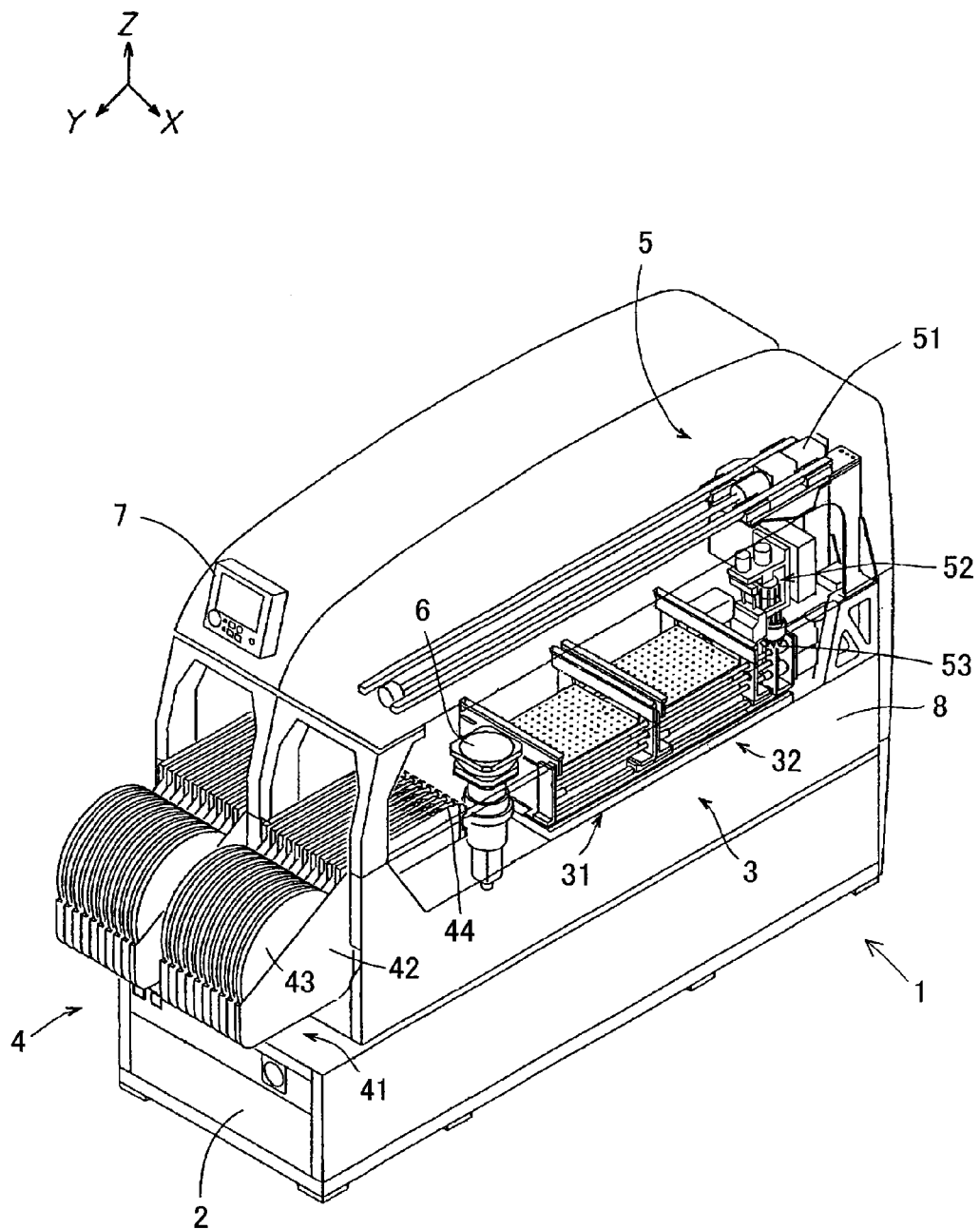
FIG. 1 is a perspective view expressing an example of the component-mounting machine.

FIG. 1 is a perspective view expressing an example of the component-mounting machine. In FIG. 1, a conveying direction of the substrate is a traverse direction (indicated by arrow X), and a direction perpendicular to the traverse direction (indicated by arrow X) within a horizontal plane is a longitudinal direction (indicated by arrow Y). Moreover, a normal direction of the horizontal plane is a height direction (indicated by arrow Z). The component-mounting machine 1 includes a substrate conveying device 3, a component feeding device 4, a component transfer device 5, a sucked-component position detection device 6 and a control device 7, which are mounted on a base 8. The base 8 is movably loaded in the longitudinal direction (indicated by arrow Y) with respect to a system base 2.

The substrate conveying device 3 carries the substrate into and out of a mounting position. The substrate conveying device 3 is a so-called double conveyor type transfer device, which is installed around a center of the longitudinal direction (indicated by arrow Y) of the component-mounting machine 1, and in which a first conveying device 31 and a second conveying device 32 are arranged side by side. The first conveying device 31 has a pair of guide rails arranged parallel to the traverse direction (indicated by arrow X) on the base 8, and a pair of conveyor belts which is directed to the pair of the guide rails and transfers the substrate loaded thereon. The first conveying device 31 is provided with a clamp device (not shown), which positions the substrate transferred to the mounting position by lifting the substrate from a side of the base 8. The second conveying device 32 has a configuration similar to the first conveying device 31.

The component feeding device 4 is provided on a front end (left side of paper of FIG. 1) of the longitudinal direction (indicated by arrow Y) of the component-mounting machine 1, and has a plurality of cassette feeders 41 detachably mounted on a feeder holder. The feeder 41 includes a feeder main body 42, a feeding reel 43 which is rotatably and detachably mounted to the feeder main body 42, and a component feeding unit 44 which is installed on a tip side (near to the center of the component-mounting machine 1) of the feeder main body 42. The feeding reel 43 is a carrier for feeding the component, and includes a carrier tape (not shown) wound thereon, which holds a predetermined number of components at regular intervals. A front edge of the carrier tape is drawn to the component feeding unit 44, thereby feeding different component for each carrier tape. The feeder 41 is able to feed, for example, relatively small components such as a chip component.

The component transfer device 5 sucks the component from the component feeding device 4 to mount the component on the substrate carried into the mounting position. The component transfer device 5 is a so-called XY robot type transfer device, which is movable in the traverse direction (indicated by arrow X) and in the longitudinal direction (indicated by arrow Y). The component transfer device 5 is installed above the component feeding device 4 from a rear end (right back side of paper of FIG. 1) of the longitudinal direction (indicated by arrow Y) of the component-mounting machine 1 to a front end (left front side of paper of FIG. 1) of the same direction. The component transfer device 5 has a head driving mechanism 51 and a component-mounting head 52.

The head driving mechanism 51 is able to drive the component-mounting head 52 in the traverse direction (indicated by arrow X) and in the longitudinal direction (indicated by arrow Y). The component-mounting head 52 has a plurality of suction nozzles 53. Each of the suction nozzles 53 sucks the component by its apical portion to mount the component on the substrate carried into the mounting position. Moreover, since the first conveying device 31 and the second conveying device 32 alternately carry the substrate in and out, it is possible to alternately mount the component using the component transfer device 5.

The base 8, between the component feeding device 4 and the substrate conveying device 3, is provided with the sucked-component position detection device 6 thereon, which detects a held position of the component. The sucked-component position detection device 6 is able to detect positional displacement or angle deviation of the component (hereinafter "sucked component PA") sucked by the suction nozzle 53. The detection results, i.e. positional displacement and angle deviation, are used for calibrating the mounting position of the sucked component PA. The sucked-component position detection device 6 will hereinafter be described in detail.

The component-mounting machine 1 can be controlled by the control device 7 installed on a front upper part of a cover. The control device 7 has a CPU and a memory (both not shown), and is able to drive the component-mounting machine 1 by executing a component mounting program stored in the memory. That is, the control device 7 drives the substrate conveying device 3, the component feeding device 4, the component transfer device 5 and the sucked-component position detection device 6 on a basis of the component mounting program, thereby mounting the component on the substrate.

The head driving mechanism 51 is driven to cause the component-mounting head 52 to move to the component feeding device 4. The plurality of the suction nozzles 53 sucks the component, respectively. When every suction nozzle 53 has sucked the component, the head driving mechanism 51 is driven to cause the component-mounting head 52 to move. When the component-mounting head 52 arrives above the sucked-component position detection device 6, images of the sucked component PA and an imaging reference mark 5M (described later) are captured simultaneously. Then, the component-mounting head 52 moves above the substrate position at the predetermined position. At this time, a moving position of the component-mounting head 52 is calibrated based on positional displacement and angle deviation, which have been detected by the sucked-component position detection device 6. The component-mounting head 52 mounts the component on the substrate, and then returns back to the component feeding device 4. The component-mounting machine 1 is able to mount a plurality of the components on the substrate by repeating this series of operations.

(2) Sucked-Component Position Detection Device

Figure 2:
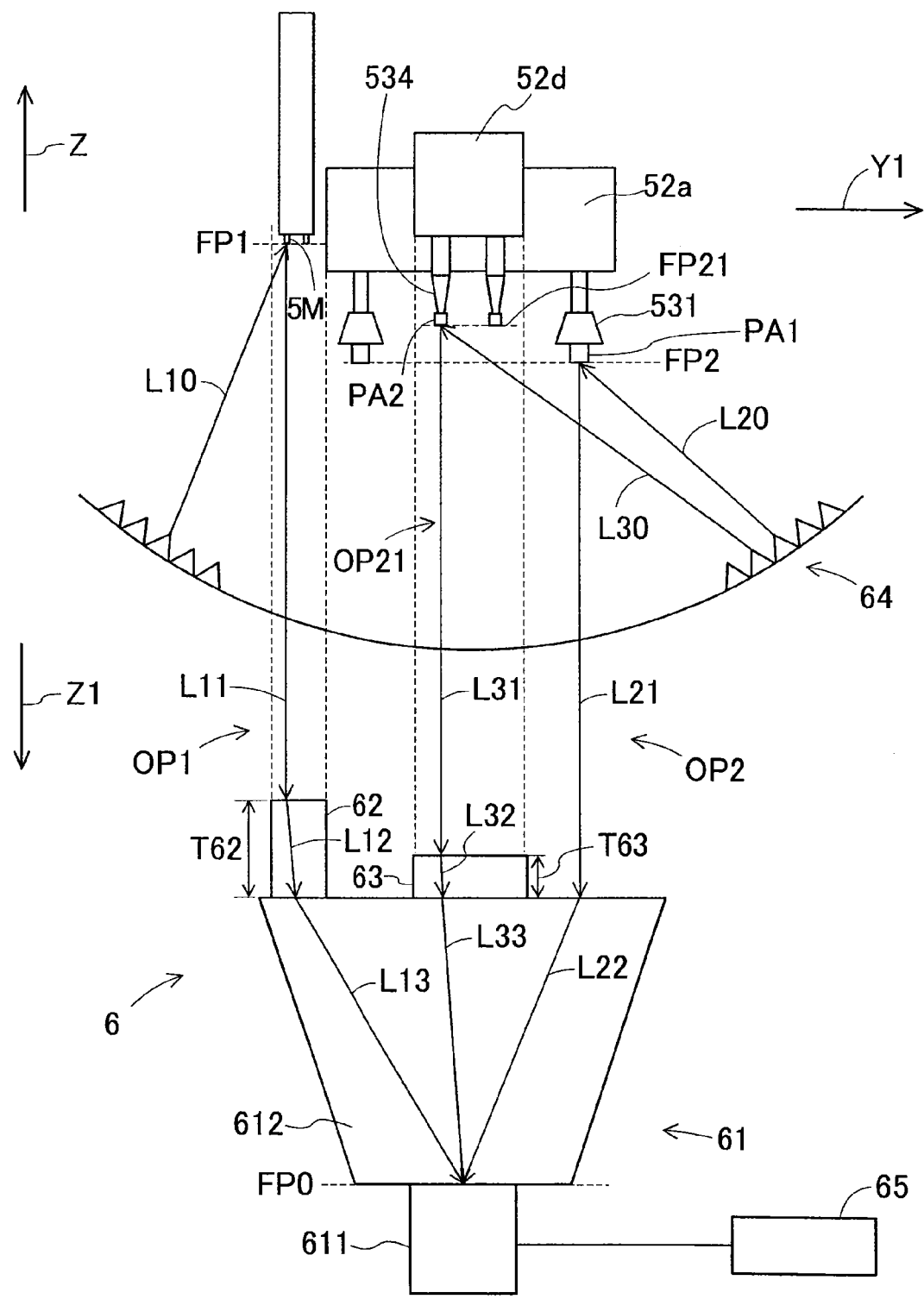
FIG. 2 is a configuration diagram schematically expressing an example of the sucked-component position detection device.

The sucked-component position detection device 6 detects a position of the sucked component PA with respect to the imaging reference mark 5M by simultaneously imaging the imaging reference mark 5M provided on the component-mounting head 52 and the sucked component PA sucked by the suction nozzle 53. FIG. 2 is a configuration diagram schematically expressing an example of the sucked-component position detection device. In FIG. 2, the component-mounting head 52 is installed as two component-mounting heads 52a and 52d, having different circumferential diameters around which the suction nozzles 53 rotate. The suction nozzle 53 of the component-mounting head 52a is indicated as the suction nozzle 531, and the sucked component PA sucked by the suction nozzle 531 is indicated as the sucked component PA1. Similarly, the suction nozzle 53 of the component-mounting head 52d is indicated as the suction nozzle 534, and the sucked component PA sucked by the suction nozzle 534 is indicated as the sucked component PA2. In the present description, the term of "sucked component PA" is properly used for illustrating a case in which the sucked components PA1 and PA2 are not distinguished.

The imaging reference mark 5M is a reflective member which reflects light emitted by a light source 64. A plurality of the imaging reference marks 5M (for example, four marks) are arranged in the traverse direction (indicated by arrow X) and in the longitudinal direction (indicated by arrow Y) at regular intervals. As shown in FIG. 2, the imaging reference marks 5M are installed on outer circumferential sides of the component-mounting heads 52a and 52d, and at a position higher than the sucked components PA1 and PA2 in the height direction (indicated by arrow Z). Therefore, it is possible to prevent the other components which have been mounted from colliding with the imaging reference marks 5M when the component-mounting head 52a and 52d move above the substrate. The sucked-component position detection device 6 includes an imaging unit 61, a first refraction member 62, a second refraction member 63, a light source 64 and an image processing unit 65. The image processing unit 65 may be installed in the control device 7.

(Imaging Unit 61)

The imaging unit 61 is installed on the side of the base 8 (a side of a direction indicated by arrow Z1 in FIG. 2) of the component-mounting machine 1 shown in FIG. 1. The imaging unit 61 uses, for example, a publicly-known CCD camera or a publicly-known CMOS camera. The imaging unit 61 has an image sensor 611, a lens 612, and an aperture. When the CCD camera is employed, the image sensor 611 is a charge-coupled device (CCD), and when the CMOS camera is employed, the image sensor 611 is a complementary metal oxide semiconductor (CMOS).

The image sensor 611 is a 2D image sensor, and is constituted of a plurality of light-receiving elements which is arranged in a plane. Therefore, the imaging unit 61 has a two-dimensional visual field. Thus, the imaging unit 61 is able to pick up the imaging reference mark 5M and the sucked component PA1 held by each of the rotating suction nozzles 531 in the same visual field, thereby simultaneously imaging the imaging reference mark 5M and the sucked component PA1. This configuration is not limited to the sucked component PA1, but can be employed for other sucked components PA.

As the lens 612, it is possible to use a publicly-known collecting lens, or to configure an optical system by combining a plurality of convex lenses and concave lenses. For example, the lens 612 uses an aspheric lens with decreased spherical aberration or a low dispersion lens which decreases chromatic aberration by lowering light dispersion. The focal length of the lens 612 is set such that the lens 612 focuses on the sucked component PA1. The sucked component PA1 is at the lowest position (height) in the height direction (indicated by arrow Z), among the sucked components PA.

(First Refraction Member 62)

The first refraction member 62 is a refraction member which alters a focal position FP1 of a first optical path OP1. For example, a cylindrical optical glass is employed as the first refraction member 62. The first refraction member 62 may use various kinds of lenses, such as a plastic lens, a fluorite lens or an aspheric lens, other than the glass, as long as it can alter the focal position FP1 of the first optical path OP1.

The first optical path OP1 is an optical path which connects the image sensor 611, the lens 612 and the imaging reference mark 5M. As shown in FIG. 2, when the light is irradiated on the imaging reference mark 5M from the light source 64 (indicated by arrow L10), reflective light reflected by the imaging reference mark 5M passes through the first refraction member 62 and the lens 612 to arrive at the image sensor 611. In FIG. 2, the first optical path OP1 is schematically indicated by arrows L11 to L13. In the first optical path OP1, a focal position on the side of the imaging reference mark 5M is indicated as a focal position FP1 of the first optical path OP1, and a focal position on the side of the image sensor 611 is indicated as a focal position FP0 of the same. In the sucked-component position detection device 6, the focal position FP0 corresponds to a reference position of the height direction (indicated by arrow Z).

The first refraction member 62 is installed on the side of the base 8 (a side of the direction indicated by arrow Z1) and at a position lower than a focal position FP2 of a second optical path OP2. In this embodiment, the first refraction member 62 is loaded on an outer circumferential side of the lens 612. The second optical path OP2 is an optical path which connects the image sensor 611, the lens 612 and the sucked component PA1. As shown in FIG. 2, when the light is irradiated on the sucked component PA1 from the light source 64 (indicated by arrow L20), reflective light reflected by the sucked component PA1 passes through the lens 612 to arrive at the image sensor 611. In FIG. 2, the second optical path OP2 is schematically indicated by arrows L21 and L22. Moreover, in the second optical path OP2, a focal position on the side of the sucked component PA1 is indicated as the focal position FP2 of the second optical path OP2. A focal position on the side of the image sensor 611 is the same as the focal position FP0.

When the first refraction member 62 is disposed between the imaging reference mark 5M and the lens 612, the first optical path OP1 has the optical length longer than the optical length when the first refraction member 62 is not disposed. That is, the focal position FP1 of the first optical path OP1 is set to a position higher than the focal position FP2 of the second optical path OP2 in the height direction (indicated by arrow Z). Therefore, it is possible to focus on the imaging reference mark 5M which is installed above the sucked component PA1 in the height direction (indicated by arrow Z). Thus, it is possible to focus on both the imaging reference mark 5M and the sucked component PA1 to simultaneously capture images of the imaging reference mark 5M and the sucked component PA1 in the same visual field.

In the present embodiment, the sucked-component position detection device 6 includes the first refraction member 62 for altering the focal position FP1 of the first optical path OP1 that connects the image sensor 611, the lens 612 and the imaging reference mark 5M. Therefore, it is possible to alter the focal position FP1 of the first optical path OP1 with respect to the imaging reference mark 5M installed at a height different than that of the sucked component PA1, thereby focusing on both the imaging reference mark 5M and the sucked component PA1.

Since the first refraction member 62 is installed at a position lower than the focal position FP2 of the second optical path OP2 that connects the image sensor 611, the lens 612 and the sucked component PA1, the first refraction member 62 and the sucked component PA1 do not collide with each other when the component-mounting head 52a moves to capture images in the longitudinal direction (indicated by arrow Y1) of FIG. 2. Therefore, it is not necessary to provide a mechanism for preventing collision of the first refraction member 62 with the sucked component PA1, thereby downsizing the sucked-component position detection device 6. This configuration is not limited to the sucked component PA1, but can be employed for other sucked components PA.

Since the first refraction member 62 is provided on the side of the base 8 (a side of the direction indicated by arrow Z1) of the component-mounting machine 1, a configuration of the component-mounting head 52a can be more simplified as compared with a case in which the first refraction member 62 is provided on the side of the component-mounting head 52a, thereby lightening the component-mounting head 52a.

(Second Refraction Member 63)

The sucked-component position detection device 6 may include the second refraction member 63. The second refraction member 63 is a refraction member which alters the focal position FP2 of the second optical path OP2, and can be formed by the same material as the first refraction member 62. The second refraction member 63 may be installed on the side of the base 8 (a side of the direction indicated by arrow Z1) and at a position lower than a focal position FP2 of a second optical path OP2. In the present embodiment, the second refraction member 63 is loaded on the lens 612, which is on an inner circumferential side than the first refraction member 62. As shown in FIG. 2, when the light is irradiated on the sucked component PA2 from the light source 64 (indicated by arrow L30), reflective light reflected by the sucked component PA2 passes through the second refraction member 63 and the lens 612 to arrive at the image sensor 611. In this case, the second optical path OP2 is indicated as the second optical path OP21. In FIG. 2, the second optical path OP21 is schematically indicated by arrows L31 to L33.

As shown in FIG. 2, the sucked component PA2 is positioned above the sucked component PA1 in the height direction (indicated by arrow Z). When the second refraction member 63 is disposed between the sucked component PA2 and the lens 612, the second optical path OP2 has the optical length longer than the optical length when the second refraction member 63 is not disposed. That is, the focal position FP21 of the second optical path OP21 is set to a position higher than the focal position FP2 of the second optical path OP2 in the height direction (indicated by arrow Z). Therefore, it is possible to focus on the sucked component PA2 which is positioned above the sucked component PA1 in the height direction (indicated by arrow Z). Thus, it is possible to focus on both the imaging reference mark 5M and the sucked component PA2 to simultaneously capture images of the imaging reference mark 5M and the sucked component PA2 in the same visual field. Since the imaging reference mark 5M is installed above any one of the sucked components PA in the height direction (indicated by arrow Z), the thickness T63 of the second refraction member 63 is set to be thinner than the thickness T62 of the first refraction member 62.

There is light that arrives at the image sensor 611 not via the first refraction member 62 among the reflective light reflected by the imaging reference mark 5M, and light that arrives at the image sensor 611 not via the second refraction member 63 among the reflective light reflected by the sucked component PA2. Due to these rays of light, a ghost may occur in the captured image. In the sucked-component position detection device 6 of the present embodiment, the aperture of the imaging unit 61 is set such that, out of reflective light emitted from the light source 64 and reflected by the imaging reference mark 5M and the sucked component PA, mainly the light parallel to the height direction (indicated by arrow Z1) of the component-mounting machine 1 arrives at the image sensor 611. Therefore, it is possible to suppress a ghost occurrence in the captured images of the imaging reference mark 5M and the sucked component PA, thereby preventing false recognition when the positions of imaging reference mark 5M and the sucked component PA are recognized.

In the present embodiment, the sucked-component position detection device 6 includes the second refraction member 63 which alters the focal position FP2 of the second optical path OP2, thus it is possible to alter the focal position FP2 of the second optical path OP2 in accordance with a height of the sucked component PA2. Since the second refraction member 63 is installed on the side of the base 8 (a side of the direction indicated by arrow Z1) and at a position lower than a focal position FP2 of a second optical path OP2, it is possible to obtain a similar effect to the aforementioned effect of the first refraction member 62.

The component-mounting head 52 of the present embodiment is a rotary head in which a plurality of the suction nozzles 53 is rotatably held on a circumference of a circle concentrically provided with an axis line. The rotary head has a different circumferential diameter around which the suction nozzle 53 rotates depending on a size of the sucked component PA. For example, the rotary head for mounting a big-size sucked component PA keeps an interval between the sucked components PA by making the circumferential diameter around which the suction nozzle 53 rotates bigger as compared with the rotary head for mounting a small-size sucked component PA. Since the rotary head has the plurality of the suction nozzles 53, the sucked components PA sucked by the suction nozzles 53 may be different. When the sucked components PA are different, the thickness of the sucked components PA will be different, thus the positions (heights) of the sucked components PA in the height direction (indicated by arrow Z) will be different.

That is, when the component-mounting heads 52 are different from each other, the circumferential diameters around which the suction nozzles 53 rotate will be different, and heights of the sucked components PA will be different. Therefore, it is necessary to set the focal position FP2 of the second optical path OP2 in accordance with the component-mounting head 52. In the present embodiment, three second refraction members 63 are concentrically arranged as viewed from the height direction (indicated by arrow Z1) in accordance with heights of the sucked components PA held by three component-mounting heads 52b to 52d, having different circumferential diameters around which the suction nozzles 53 rotate.

Figure 3:
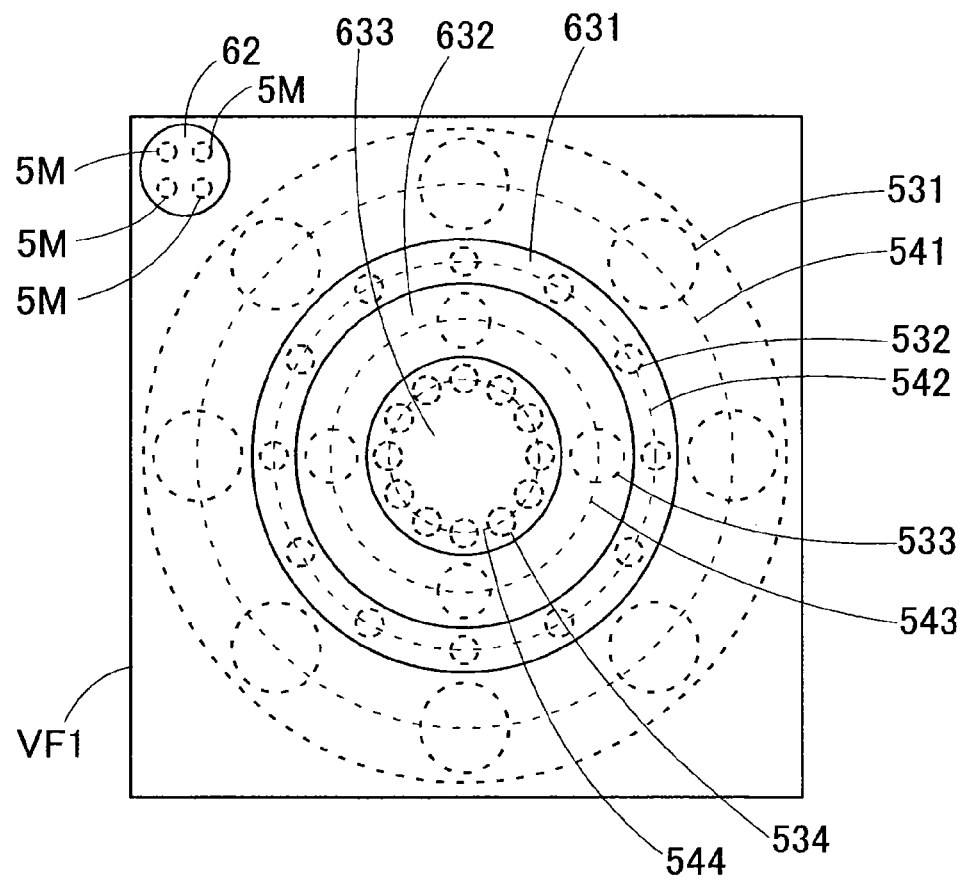
FIG. 3 is a plan view illustrating a state in what three second refraction members are concentrically arranged.

FIG. 3 is a plan view illustrating a state in what three second refraction members are concentrically arranged. In FIG. 3, the three second refraction members 63 are distinguished such that the second refraction member 63 arranged on an outermost circumferential side is indicated as the second refraction member 631, the second refraction member 63 arranged on an inner circumferential side of the second refraction member 631 is indicated as the second refraction member 632, and the second refraction member 63 arranged on an inner circumferential side of the second refraction member 632 is indicated as the second refraction member 633. The first refraction member 62 and the second refraction members 631 to 633 are loaded on the lens 612. The visual field of the imaging unit 61 is indicated as a region VF1.

In the case of the component-mounting heads 52a to 52d, the symbols 52a, 52b, 52c and 52d are allocated in a descending order of greatness of circumferential diameter around which the suction nozzle 53 rotates. The component-mounting heads 52a, 52b, 52c and 52d have the suction nozzles 531, 532, 533 and 534, respectively. In FIG. 3, the circumference around which the suction nozzle 531 rotates is a circumference 541, the circumference around which the suction nozzle 532 rotates is a circumference 542, the circumference around which the suction nozzle 533 rotates is a circumference 543, and the circumference around which the suction nozzle 534 rotates is a circumference 544. In FIG. 2, the component-mounting heads 52a and 52d are illustrated while the component-mounting heads 52b and 52c are omitted.

The second refraction member 631 has the focal position FP2 of the second optical path OP2, which is set in accordance with the height of the sucked component PA held by the component-mounting head 52b. The second refraction member 632 has the focal position FP2 of the second optical path OP2, which is set in accordance with the height of the sucked component PA held by the component-mounting head 52c. The second refraction member 633 has the focal position FP2 of the second optical path OP2, which is set in accordance with the height of the sucked component PA2 held by the component-mounting head 52d. As stated above, the focal length of the lens 612 is set in accordance with the height of the sucked component PA1 held by the component-mounting head 52a. When the component-mounting head 52a is used, the second refraction member 63 is not necessary.

In the present embodiment, three second refraction members 631 to 633 are concentrically arranged in accordance with heights of the sucked components PA held by three component-mounting heads 52b to 52d, having different circumferential diameters around which the suction nozzles 53 rotate. Therefore, it is possible to set the focal position FP2 of the second optical path OP2 in accordance with heights of the sucked components PA of each of the component-mounting heads 52b to 52d, respectively. Moreover, it is unnecessary to replace the second refraction member 63 every time the component-mounting head 52 is replaced, thereby decreasing manhours.

(Light Source 64)

The light source 64 can irradiate the imaging reference mark 5M and the sucked component PA with light. As the light source 64, for examples, a publicly-known light-emitting diode (LED) may be used, and wavelength of the emitted light is not limited. As shown in FIG. 2, when the component-mounting head 52 arrives above the sucked-component position detection device 6, the control device 7 outputs an imaging-start signal to the imaging unit 61 and the light source 64. When the imaging-start signal is output, the light source 64 irradiates the imaging reference mark 5M and the sucked component PA with light during an exposure time of the imaging unit 61. The imaging unit 61 captures images of the imaging reference mark 5M and the sucked component PA simultaneously.

While the component-mounting head 52 moves in the longitudinal direction (indicated by arrow Y1) without stopping above the sucked-component position detection unit 6, the imaging unit 61 captures images of the imaging reference mark 5M and the sucked component PA simultaneously. At this time, the imaging unit 61 has the aperture which is set such that, out of reflective light emitted from the light source 64 and reflected by the imaging reference mark 5M and the sucked component PA1, mainly the light parallel to the height direction (indicated by arrow Z1) of the component-mounting machine 1 arrives at the image sensor 611. Therefore, it is possible to suppress a ghost occurred in the captured images of the imaging reference mark 5M and the sucked component PA1, thereby preventing false recognition when the positions of imaging reference mark 5M and the sucked component PA1 are recognized.

In the present embodiment, the first refraction member 62 and the second refraction member 63 are installed on the side of the imaging unit 61 rather than the light source 64 which irradiates the imaging reference mark 5M and the sucked component PA with light. Therefore, it is possible to prevent the light, emitted from the light source 64, from being guided directly to the first refraction member 62 and the second refraction member 63 and being reflected by the first refraction member 62 and second refraction member 63. Thus, it is possible to prevent the reflective light from causing an adverse effect on imaging of the imaging reference mark 5M and the sucked component PA.

(Image Processing Unit 65)

The image processing unit 65 processes the images of the imaging reference mark 5M and the sucked component PA, which are captured by the imaging unit 61, and calculates the position of the sucked component PA with respect to the imaging reference mark 5M. The memory of the control device 7 stores a legitimate holding position of each sucked component PA with respect to the imaging reference mark 5M in advance. The image processing unit 65 matches the imaging reference mark 5M stored in the memory and the imaging reference mark 5M captured by the imaging unit 61. The image processing unit 65 calculates positional displacement and angle deviation of each sucked component PA by comparing the legitimate holding position stored in the memory and a holding position captured by the imaging unit 61. Based on the calculated results, such as positional displacement and angle deviation, the mounting position of the sucked component PA is calibrated.

(3) Others

The present invention is not limited to embodiment as stated above and illustrated in accompanying drawings, but may be modified and implemented appropriately without departing from the scope of the invention. For example, the embodiment shows three second refraction members 63 which are concentrically arranged. However, a number of the second refraction members 63 is not limited to 3; it can be appropriately modified in accordance with a circumferential diameter around which the suction nozzle 53 rotates.

Moreover, a shape of the second refraction member 63 is not limited to a concentric circle. For example, cylindrical second refraction members 63 may be scattered on a portion corresponding to the suction nozzles 532 to 534 as shown in FIG. 3. In the embodiment, three second refraction members 631 to 633 are loaded on the lens 612. However, it is possible to load the second refraction member 63 corresponding to the used component-mounting head 52 on the lens 612. When the component-mounting head 52 is replaced, the second refraction member 63 may be replaced at the same time.

REFERENCE SIGNS LIST

1: component-mounting machine,
52: component-mounting head,
53: suction nozzle,
5M: imaging reference mark,
6: sucked-component position detection unit,
61: imaging unit,
611: image sensor,
612: lens,
62: first refraction member,
63: second refraction member,
64: light source,
OP1: first optical path,
OP2: second optical path,

The invention claimed is:

1. A component-mounting machine, comprising:
a component-mounting head that includes a suction nozzle which sucks a component to mount on a substrate and includes an imaging reference mark; and
a sucked-component position detection device which captures images of the imaging reference mark and the sucked component sucked by the suction nozzle simultaneously to detect a position of the sucked component with respect to the imaging reference mark, wherein
the sucked-component position detection device includes an imaging unit which is provided on a base side of the component-mounting machine and has an image sensor and a lens; and a first refraction member which alters a focal position of a first optical path that connects the image sensor, the lens and the imaging reference mark, the first refraction member is provided on the base side and at a position lower than a focal position of a second optical path that connects the image sensor, the lens, and the sucked component, and the imaging reference mark is higher than the sucked component in a height direction of the component-mounting head.

2. The component-mounting machine according to claim 1, wherein the sucked-component position detection device further includes a second refraction member which alters the focal position of the second optical path, and the second refraction member is provided on the base side and at a position lower than the focal position of the second optical path.

3. The component-mounting machine according to claim 1, wherein the sucked-component position detection device includes a light source which irradiates the imaging reference mark and the sucked component with light, and the first refraction member is provided on the imaging unit at a position lower than a lowermost portion of the light source.

4. The component-mounting machine according to claim 1, wherein the sucked-component position detection device includes a light source which irradiates the imaging reference mark and the sucked components with light, and the imaging unit has an aperture which is set such that, out of reflective light emitted from the light source and reflected by the imaging reference mark and the sucked component, mainly light parallel to a height direction of the component-mounting machine arrives at the image sensor.

5. The component-mounting machine according to claim 2, wherein the component-mounting head is a rotary head in which a plurality of the suction nozzles are rotatably held on a circumference of a circle concentrically provided with an axis line, and a plurality of the second refraction members are concentrically arranged in accordance with a height of a plurality of the sucked components on a plurality of the component-mounting heads which have different circumferential diameters.

* * * * *